(12) United States Patent
Hailey

(10) Patent No.: US 8,023,572 B2
(45) Date of Patent: Sep. 20, 2011

(54) COMMUNICATION INTERFACE EMPLOYING A DIFFERENTIAL CIRCUIT AND METHOD OF USE

(75) Inventor: Jeffrey C. Hailey, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 1261 days.

(21) Appl. No.: 11/564,496

(22) Filed: Nov. 29, 2006

(65) Prior Publication Data

US 2008/0122489 A1 May 29, 2008

(51) Int. Cl.
*H04B 3/00* (2006.01)
*H04L 25/00* (2006.01)

(52) U.S. Cl. ........ 375/258; 336/145; 336/146; 336/147; 336/148; 333/119; 327/86; 361/35; 361/36

(58) Field of Classification Search .................. 375/258; 336/145–148; 333/119; 327/86; 361/35–36
See application file for complete search history.

(56) References Cited

U.S. PATENT DOCUMENTS

| 1,998,960 | A | 12/1930 | Kaar |
| 5,113,159 | A | 5/1992 | Adriaenssens et al. |
| 5,321,372 | A | 6/1994 | Smith |
| 5,659,273 | A | 8/1997 | Harpham |
| 5,825,259 | A | 10/1998 | Harpham |
| 6,490,325 | B1 | 12/2002 | Fiedler et al. |
| 7,129,872 | B1 * | 10/2006 | Qvortrup et al. ............. 341/139 |
| 2007/0178850 | A1 * | 8/2007 | Sandahl et al. ................ 455/84 |

* cited by examiner

*Primary Examiner* — Curtis B Odom
(74) *Attorney, Agent, or Firm* — Larson Newman, LLP

(57) ABSTRACT

A communication interface employing a differential circuit and method of use is disclosed. In one form, a circuit operable to communicate signals via a communication bus can include a differential signaling circuit operable to be coupled to a communication bus. The differential signaling circuit can include a first current carrying element and a second current carrying element. The circuit can also include a shunt circuit including a first transformer. The first transformer can include a primary transformer element and a secondary transformer element. The first transformer can be operably associated with the communication bus.

20 Claims, 3 Drawing Sheets

COMMUNICATION INTERFACE EMPLOYING A DIFFERENTIAL CIRCUIT AND METHOD OF USE

FIELD OF THE DISCLOSURE

This disclosure relates generally to electronic circuits, and more particularly, to a communication interface employing a differential circuit and method of use.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

Communication between information handling systems and various internal and external components has expanded to include various different types of communication mediums and associated communication protocols. For example, serial and parallel communication buses, such as Universal Serial Buses (USBs), a Peripheral Component Interconnect (PCI) buses, PCI Express buses, etc., can be used to connect peripheral devices or components using a specific communication protocol based on the type of bus employed.

Communication over some buses can be established using firmware, such as a driver or application program interface (API), that is usually transparent to end users. Various standards have been established to develop drivers or APIs to facilitate allowing third party devices and components to comply with communication standards. For example, standard protocols for specific bus architectures are used when such devices are connected to information handling systems.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

Figure 1:
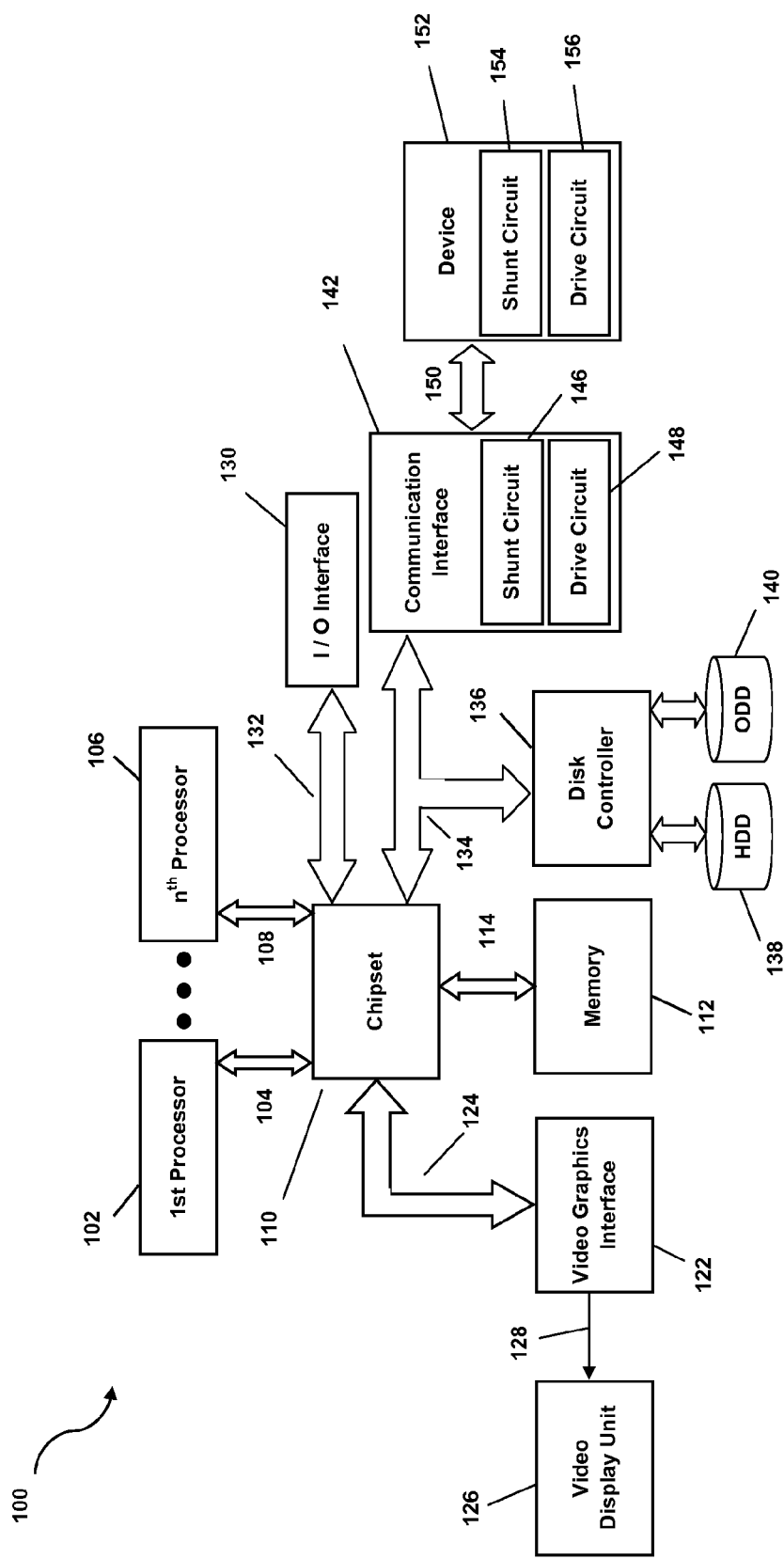
FIG. 1 illustrates a block diagram of an information handling system according to one aspect of the disclosure.

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

As indicated above, the following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings may certainly be utilized in this application. The teachings may also be utilized in other applications and with several different types of architectures such as distributed computing architectures, client/server architectures, or middleware server architectures and associated components.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a PDA, a consumer electronic device, a network server or storage device, a switch router, wireless router, or other network communication device, or any other suitable device and may vary in size, shape, performance, functionality, and price. The information handling system can include memory, one or more processing resources such as a central processing unit (CPU) or hardware or software control logic. Additional components of the information handling system can include one or more storage devices, one or more communications ports for communicating with external devices as well as various input and output (I/O) devices, such as a keyboard, a mouse, and a video display. The information handling system can also include one or more buses operable to transmit communications between the various hardware components.

According to one aspect, a communication interface can include a drive circuit including a differential signaling circuit operable to be coupled to a communication bus. The communication interface can also include a shunt circuit coupled to the differential signaling circuit. The shunt circuit can include a first transformer circuit having a primary transformer element coupled between a first terminal and a second terminal. Additionally, the first terminal can be coupled to the differential signaling circuit and a first communication line. The second terminal can be coupled to a bias voltage level. The shunt circuit can further include a secondary transformer element coupled between a third terminal and a fourth terminal. According to one aspect, the third terminal can be coupled to the bias voltage level, and the fourth terminal can be coupled to the differential signaling circuit, and a second communication line. The communication interface can further include a communication port coupled to the first communication line and the second communication line. The communication port can be coupled to a communication bus.

According to a particular aspect, a circuit operable to communicate signals via a communication bus is provided. The circuit can include a differential signaling circuit operable to be coupled to a communication bus. The differential signaling circuit can include a first current carrying element and a second current carrying element. The circuit can further include a shunt circuit including a first transformer. In one form, the first transformer can include a primary transformer element coupled between a first terminal and a second terminal. The first terminal can be coupled to a first current carrying element of the differential signaling circuit, and a first communication line operably associated with the communication bus. The second terminal can be coupled to a bias voltage level. The circuit can further include a secondary transformer element coupled between a third terminal and a fourth terminal. According to one aspect, the third terminal can be coupled to the bias voltage level, and the fourth terminal can coupled to the second current carrying element of the differential signaling circuit. The fourth terminal can also be coupled to a second communication line operably associated with the communication bus.

According to a further aspect of the disclosure, an information handling system is disclosed. The information handling system can include a communication port operable to be coupled to a communication bus operably associated with an electronic device. The information handling system can further include a differential signaling circuit operable to be coupled to the communication bus to communicate with the electronic device. In one form, a shunt circuit can be coupled to the differential signaling circuit. The shunt circuit can include a first transformer having a primary transformer element coupled between a first terminal and a second terminal. In one form, the first terminal can be coupled to a first current carrying element of the differential signaling circuit, and a first communication line operably associated with the communication bus. The primary transformer element can further include the second terminal coupled to a bias voltage level. In one form, the first transformer can include a secondary transformer element coupled between a third terminal and a fourth terminal. The third terminal can be coupled to the bias voltage, and the fourth terminal can be coupled to a second current carrying element of the differential signaling circuit. The fourth terminal can also be coupled to a second communication line operably associated with the communication bus.

FIG. 1 illustrates a block diagram of an exemplary embodiment of an information handling system, generally designated at 100. As shown in FIG. 1, the information handling system 100 can include a first physical processor 102 coupled to a first host bus 104 and can further include additional processors generally designated as $n^{th}$ physical processor 106 coupled to a second host bus 108. The first physical processor 102 can be coupled to a chipset 110 via the first host bus 104. Further, the $n^{th}$ physical processor 106 can be coupled to the chipset 110 via the second host bus 108. The chipset 110 can support multiple processors and allows for simultaneous processing of multiple processes and supports the exchange of information within information handling system 100 during multiple processing operations.

According to one aspect, the chipset 110 can be referred to as a memory hub or a memory controller. For example, the chipset 110 the can include an Accelerated Hub Architecture (AHA) that uses a dedicated bus to transfer data between first physical processor 102 and the $n^{th}$ physical processor 106. For example, the chipset 110 including an AHA enabled-chipset can include a memory controller hub and an input/output (I/O) controller hub. As a memory controller hub, the chipset 110 can function to access the first physical processor 102 using the first bus 104 and the nth physical processor 106 using the second host bus 108. The chipset 110 can also be used as a memory interface for accessing the memory 112 using a third host bus 114. In a particular embodiment, the host buses 104, 108, and 114 can be individual buses or part of the same bus. The chipset 110 can also bus used as bus control and can handle transfers between the host buses 104, 108, 114.

According to one aspect, the chipset 110 can include an application specific chipset that can connect to various buses, and integrates other system functions. For example, the chipset 110 can be an Intel® Hub Architecture (IHA) chipset also that can include two parts, a Graphics and AGP Memory Controller Hub (GMCH) and an I/O Controller Hub (ICH). For example, an Intel 820E, an Intel 815E chipset, available from the Intel Corporation of Santa Clara, Calif., or combinations thereof, that can include at least a portion of the chipset 110. The chipset 110 can also be packaged as an application specific integrated circuit (ASIC).

In one form, the chipset 110 can be coupled to a video graphics interface 122 using a fourth host bus 124. A video graphics interface 122 can be provided as an Accelerated Graphics Port (AGP) interface operable to display content within a video display unit 126. The video graphics interface 122 can output a video display content output 128 to the video display unit 126. The video display unit 126 can include one or more types of video displays such as a flat panel displays (FPDs), Cathode Ray Tube displays (CRTs) or other type of display devices.

In an alternate embodiment, the chipset 110 can be used as a chipset employing a Northbridge/Southbridge chipset configuration (not illustrated). For example, a Northbridge portion of the chipset 110 can communicate with the first physical processor 102, and can control interaction with the memory 112. The Northbridge portion can also control interaction with the fourth host bus 124 operable as a PCI bus, and activities for the video graphics interface 122. The Northbridge portion can also communicate with the first physical processor 102 using the first bus 104, and the second bus 108 coupled to the $n^{th}$ physical processor 106. The chipset 110 can also include a Southbridge portion (not illustrated) of the chipset 110 and can handle I/O functions of the chipset 110. The Southbridge portion can be coupled to the I/O interface 130 and can manage the basic forms of input/output (I/O) such as Universal Serial Bus (USB) I/O, serial I/O, audio outputs, Integrated Drive Electronics (IDE) I/O, and Industry Standard Architecture (ISA) I/O for the information handling system 100. According to one aspect, the information handling system 100 can include the I/O interface 130 operably coupled to the chipset 110 using an I/O bus 132. In one form, the I/O interface 130 can include serial buses, parallel buses, or any combination thereof and can be provided as an industry standard bus or a proprietary bus.

According to another aspect, the information handling system 100 can also include a component bus 134 operably coupled to a disk controller 136. The component bus 134 can be operable to connect one or more devices or components using a universal serial bus (USB) or other industry standard buses or proprietary buses, such as ISA, SCSI, I2C, SPI, or PCI buses, or any combination thereof, can be also provided in association with, or independent of, the component bus 134. In one form, the component bus 134 can connect to the disk controller 136 operable to connect one or more disk drives such as a hard disk drive (HDD) 138, an optical disk drive (ODD) 140 such as a Read/Write Compact Disk (R/W-CD), a Read/Write Digital Video Disk (R/W-DVD), a Read/Write mini Digital Video Disk (R/W mini-DVD), or other type of drive.

According to one aspect, the component bus 134 can be coupled to a communication interface 142 operable to couple one or more devices using one or more communication ports associated with the communication interface 142. The communication interface 142 can include a drive circuit 148 coupled to a shunt circuit 146. The communication interface 142 can also be coupled to a device communication bus 150 operable to communicate with one or more devices illustrated generally as a device 152. The device 152 can include various types of electronic devices and in one form includes a device shunt circuit 144, and a device drive circuit 156.

In one embodiment, the communication interface 142 can include a serial-attached SCSI (SAS) enabled communication interface operable to couple one or more SAS enabled devices. In another embodiment, the communication interface 142 can include a various communication interfaces, buses, electronic devices, such as, USB, Ethernet, Serial SATA (SATA), Infiniband, FibreChannel, PCI-Express, Low Voltage Differential Signaling (LVDS), Digital Video Interface (DVI), High Definition Multimedia Interface (HDMI), DisplayPort, Unified Display Interface (UDI), FireWire, or combinations thereof.

During operation, the information handling system 100 can communicate with the device 152 using the communication interface 142, and the device communication bus 150. The drive circuit 148 can be operable to output and receive communication signals communicated using the device communication bus 150. The communication interface 142 including the shunt circuit 146 can be used to reduce noise or electromagnetic effects that can occur during communication with the device 152 using device communication bus 150. For example, during high-speed communications, the information handling system 100 including the device communication bus 150 can emit an undesired level of noise or electromagnetic waves. As such, the shunt circuit 146 can be provided in association with the communication interface 142 to reduce undesired outputs. In another form, the device 152 can include the device shunt circuit 154 to reduce undesired outputs. As such, one or both of the shunt circuit 146 and the device shunt circuit 154 can be employed as desired. According to one aspect, the communication interface 142 can include a differential signaling circuit operable to provide a an output signal and a binary compliment that can be transmitted to the device 152 using a pair of interconnects provided in association with the communication bus 150. The device drive circuit 154 can be operable to receive the transmissions and the device 152 can subtract the output signal and the binary compliment to obtain the data communicated from the communication interface 142. The shunt circuit 146 can include a circuit operable to ensure sufficient signal amplitude can be provided when communicating the output signal and the binary compliment while reducing interference that can occur in association with communicating signals using over the communication bus 150.

Figure 2:
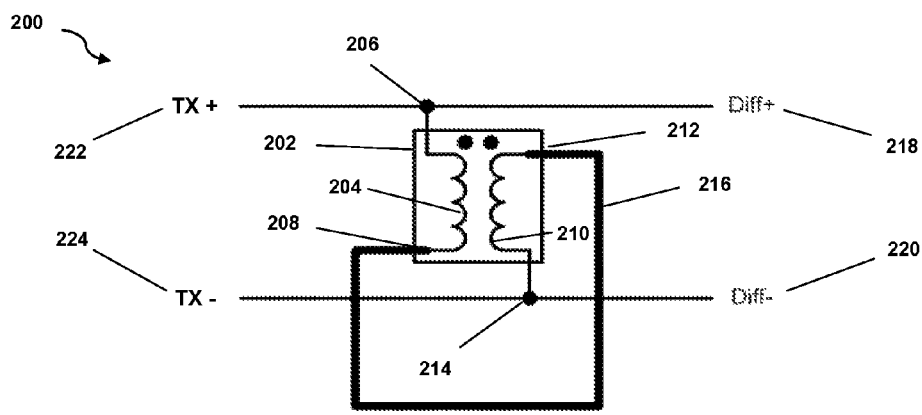
FIG. 2 illustrates a schematic diagram of a shunt circuit operable for use with a differential circuit according to another aspect of the disclosure.

FIG. 2 illustrates a schematic diagram of a shunt circuit 200, operable for use with a differential signaling circuit that can be used in association with the communication interface 142 of the information handling system 100 illustrated in FIG. 1. The shunt circuit 200 can be employed, in whole or in part, by the information handling system 100 illustrated in FIG. 1 or other types of information handling systems, circuits, devices, components, or any combination thereof that can benefit from one or more features or functions of the shunt circuit 200.

The shunt circuit 200 can include a transformer circuit 202 including a primary transformer element 204 having a first terminal 206, and a second terminal 208. The transformer circuit 202 can also include a secondary transformer element 210 having a third terminal 212, and a fourth terminal 214. The shunt circuit 200 can also include a shorting element 216 placed between the second terminal 208, and the third terminal 212 of the transformer circuit 202.

In one form, the shunt circuit 200 can be coupled between a positive differential terminal output 218 and a negative differential terminal output 220 of a differential signaling circuit (not illustrated). For example, the shunt circuit 200 can be used with the differential signaling circuit 302 illustrated in FIG. 3 below or other types of differential signaling circuits as desired. Additionally, the shunt circuit 200 can also be coupled to a first communication line 222 and a second communication line 224 operably associated with a communication bus. For example, the shunt circuit 200 can include the first terminal 206 coupled to the first communication line 222 operable to transmit a positive portion of a differential communication signal. Additionally, the shunt circuit 200 can also include the third terminal 214 coupled to the second communication line 224 operable to transmit a negative portion of a differential communication signal. In one form, providing a short circuit between terminal second terminal 208 and third terminal 212 using shorting element 216 provides a common-mode voltage portion of a signal for the shunt circuit 200. For example, a common-mode voltage can be shunted by connecting the shorting element 216 to ground or a voltage (not illustrated). For example, the shorting element 216 can be coupled either directly to a ground or voltage, or using a component such as a resistor or capacitor. As such, the shunt circuit 200 can be provided in association with a differential signaling circuit, such as a common-mode differential signaling circuit, for communicating signals via a communication bus.

During operation, the shunt circuit 200 can receive a positive portion of a differential signal using the positive differential terminal output 218. Additionally, the shunt circuit 200 can receive a negative portion of a differential signal using the negative differential terminal output 220. The positive portion of the differential signal can be coupled to the first terminal 206. The primary transformer element 204 can detect the signal and couple a transformer output to the secondary transformer element 210. In one form, the primary transformer element 204 and the secondary transformer element 210 can be provided as an in-phase transformer. As such, the signal output by the primary transformer element 204 will be in phase with the signal output by the secondary transformer element 210. In one form, the output of the secondary transformer element 210 can be felt at the negative differential terminal 220 and the second transmission line 224. In this manner, the shunt circuit 200 can provide a shunting effect across the positive differential terminal 218 and the negative differential terminal 220, prior to outputting differential signals to the first communication line 222 and the second communication line 224. Additionally, the shunt circuit 200 can provide a DC bias level at the outputs of the differential signaling circuit to effectively raise the amplitude of the output level while filtering any common-mode noise that may be induced or presented. As such, the bias voltage provided by the shunt circuit 200 can raise a realized upper voltage limit of outputs from the differential signaling circuit to allow for a greater signal amplitude and noise reduction.

Figure 3:
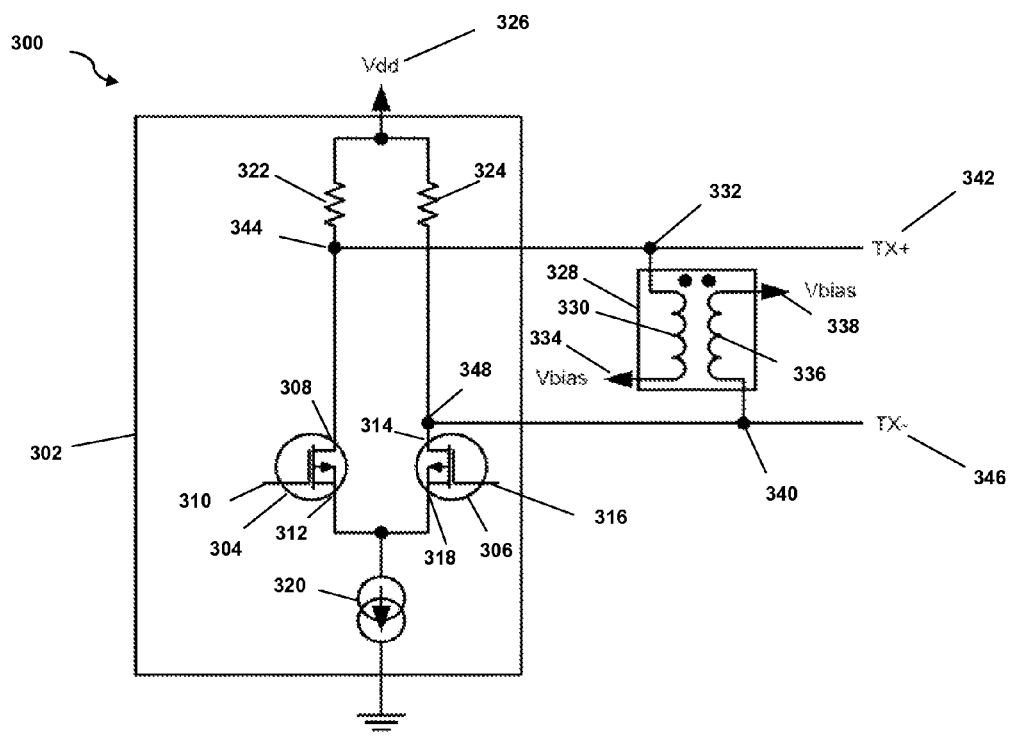
FIG. 3 illustrates a schematic diagram of differential drive circuit employing a shunt circuit according to a further aspect of the disclosure.

FIG. 3 illustrates a schematic diagram of differential signaling circuit employing a shunt circuit and depicted generally as drive circuit 300. The drive circuit 300 can be used in association with the communication interface 142 of the information handling system 100 illustrated in FIG. 1. The drive circuit 300 can also be employed, in whole or in part, by the information handling system 100 illustrated in FIG. 1 or other types of information handling systems, circuits, devices, components, or any combination thereof, that can benefit from one or more features or functions of the drive circuit 300.

The drive circuit 300 can include a differential signaling circuit 302 that can include a first current carrying element such as a first transistor 304 and a second current carrying element such as a second transistor 306. The first transistor 304 can include a first drain terminal 308, a first bias element such as a first gate terminal 310, and a first source terminal 312. The second transistor 306 includes a second drain terminal 314, a second gate terminal 316, and a second source terminal 318. The first source 312 and the second source 318 can be coupled to a constant current source 320. Additionally, the first transistor 304 can include a first drain resistor 322 coupled to first drain terminal 308. The second transistor 306 also includes a second drain resistor 324 coupled to the second drain 314. A voltage source 326 can be coupled to the first drain resistor 322 and the second drain resistor 324 to bias the first transistor 304 and the second transistor 306. Although first transistor 304 and second transistor 306 are illustrated as Field Effect Transistors (FETs), it should be understood that other types of current carrying devices such as transistors, devices, or combinations of electronics can be employed, including but not limited to, N-Channel devices, P-Channel devices, Bi-Polar Transistors, P-N-P devices, N-P-N devices, or any combination thereof.

According to one aspect, the drive circuit 300 can also include a shunt circuit 328 including a transformer circuit having a primary element 330, a first terminal 332, and a second terminal 334. Additionally, the shunt circuit 328 can also include a secondary element 336 having a third terminal 338 and a fourth terminal 340. According to one aspect, the first terminal 332 can be coupled to a first communication line 342, and a first node 344 located between the first drain 308 and the first drain resistor 322. Additionally, the fourth terminal 340 can be coupled to a second communication line 346, and a second node 348 located between the second drain 314 and the second drain resistor 324.

During operation, the voltage source 326 can couple an operating voltage to the first transistor 304 and the second transistor 306 to produce an operating state. Additionally, a bias voltage level (Vbias) can be provided to the second terminal 334 of the first transformer element 330, and to the third terminal 338 of the second transformer element 336. In one form, the drive circuit 300 can be realized as a constant current switch. For example, the first transistor 304 and the second transistor 306 can share a constant current provided by the constant current source 320. As an input to first gate terminal 310 and an input to second gate terminal 316 are changed or switched, the output at first node 344 and the output at second node 348 are changed or switched, while the current flowing through the first transistor 304 and the second transistor 306 remains constant or approximately equal. In this manner, a nearly linear switch of the two output voltages for the fist transistor 304 and the second transistor 306 can be provided to first node 344 and second node 348 respectively. Additionally, the outputs can be coupled to first communication line 342 and second communication line 346.

In one embodiment, an input can be provided to the first gate 310 and the second gate 316. If a difference in inputs between the first gate 310 and the second gate 316 is detected, an output level can be provided by either the first transistor 304 or the second transistor 306. The output level can be coupled to the first node 344, and further to the first terminal 332 of the primary transformer 330. If a difference exists between the output coupled to the first terminal 332 and the bias voltage level coupled to the second terminal 334, a transformer output can be output from the primary transformer element 330 to the secondary transformer element 336. Additionally, the transformer output can also be coupled to the fourth terminal 340 and to the second transmission line 346. In this manner, the shunt circuit 328 can be used to isolate the differential signaling circuit 302 from the first communication line 342 and the second communication line 346. Additionally, the shunt circuit 328 can provide a DC bias level at the outputs of the differential signaling circuit 302 and raise an amplitude of the output level while filtering common mode noise that may be induced or presented to the system or drive circuit 300. As such, the bias voltage provided by the shunt circuit 328 raises a realized upper voltage limit of for the output of the differential signaling circuit 302 and can allow for greater signal amplitude.

Figure 4:
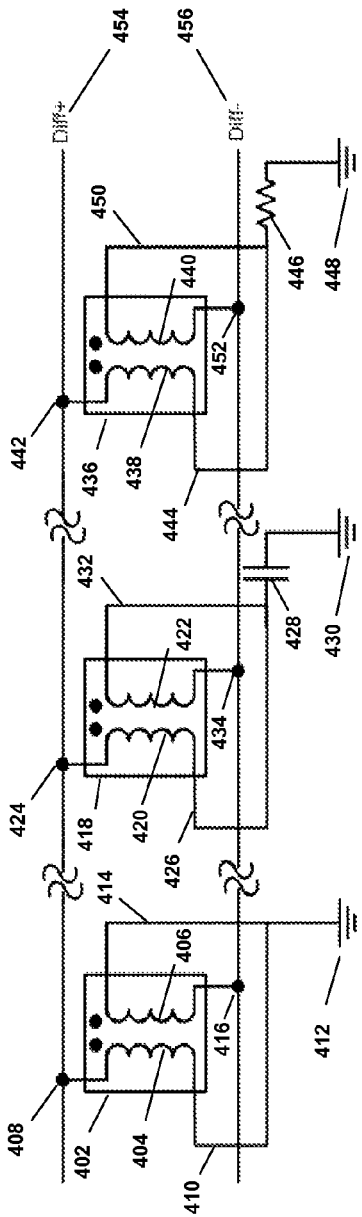
FIG. 4 depicts a schematic diagram illustrating various shunt circuits operable to be used in association with a differential driver circuit according to a one aspect of the disclosure.

FIG. 4 depicts a schematic diagram illustrating a various termination elements for a shunt circuit operable to be used in association with a differential drive circuit. The various shunt circuits can be used in association with the communication interface 142 of the information handling system 100 illustrated in FIG. 1, and can be employed, in whole or in part, by the information handling system 100 illustrated in FIG. 1 or other types of information handling systems, circuits, devices, components, or any combination thereof that can benefit from one or more features or functions of the shunt circuits. Additionally, the values of components can vary based on a specific application. For example, the overall impedance value of a communication bus may affect the values of various transformer, capacitive, and resistive elements that can be used to provide one or more of the shunt circuits 400 illustrated.

The shunt circuits 400 can be provided as separate shunt circuits or can be used in any combination as desired. A first shunt 402 can include an in-phase transformer having a primary transformer element 404 and a secondary transformer element 406. The primary transformer element 404 can be coupled to a first terminal 408 and a second terminal 410 coupled to a first ground reference 412. The first terminal 408 can also be coupled to a positive differential terminal 454 of a differential drive circuit operably associated with a communication bus (not illustrated). The secondary element 406 can also be coupled to a third terminal 414 and a fourth terminal 416. The third terminal 414 can be coupled to the first ground reference 412. The fourth terminal 416 can be coupled to a negative terminal 456 of the differential drive circuit for the communication bus. During operation, the first ground reference 412 can couple a ground bias voltage level at a portion of the primary transformer element 404 and the secondary transformer element 406.

In one form, a second shunt 418 can be used and can include an in-phase transformer having a second primary transformer element 420 and a second secondary transformer element 422. The second primary transformer element 420 can be coupled to a fifth terminal 424 and a sixth terminal 426. The sixth terminal 426 can be coupled to a capacitive element 428 that can be further coupled to a second ground reference 430. The second primary transformer element 420 can also be coupled to a seventh terminal 432 and an eighth terminal 434. The seventh terminal 432 can be coupled to the capacitive element 428. Additionally, the eight terminal 434 can be coupled to negative differential terminal 456, and the first terminal can be coupled to the positive differential terminal 454. During operation, the second shunt 418 can provide a termination for a communication bus coupled to the positive differential terminal 454 and the negative differential terminal 456. Capacitive coupling can be provided by coupling the second shunt 418 to the second ground reference 430 using the capacitive element 428. The capacitive element 428 can include various ranges of values which can provide an effective short-circuit at frequencies when common-mode noise is present.

In another form, a third shunt 436 can include an in-phase transformer having a third primary transformer element 438 and a third secondary transformer element 440. The third primary transformer element 438 can be coupled to a ninth terminal 442 and a tenth terminal 444. The tenth terminal 444 can be coupled to a resistive element 446 that can be coupled to a third ground reference 448. The ninth terminal 442 can be further coupled to the positive differential terminal 454. The third secondary transformer element 440 can also be coupled an eleventh terminal 450 and a twelfth terminal 456. The eleventh terminal 450 can be coupled to the resistive element 446. The twelfth terminal 452 can also be coupled to the negative terminal 456 of the differential circuit for the communication bus (not illustrated). During operation, the third shunt 436 can provide a termination for a communication bus coupled to the positive differential terminal 442 and the negative differential terminal 456. Resistive coupling can be provided by coupling the third shunt 426 to the third ground reference 448 using the resistive element 446. The capacitive element 428 can include various ranges of values which can provide an effective short-circuit at frequencies when common-mode noise is present.

In one form, one or more of the shunt circuits 400 can be used by a drive circuit such as the drive circuit 300 illustrated in FIG. 3 operable to be used in association with one or more type of communication bus, or any other type of circuit that may benefit from one or more of the shunt circuits 400. Additionally, various component values can be used based on the application of one or more of the shunt circuits 400 of FIG. 4.

Figure 5:
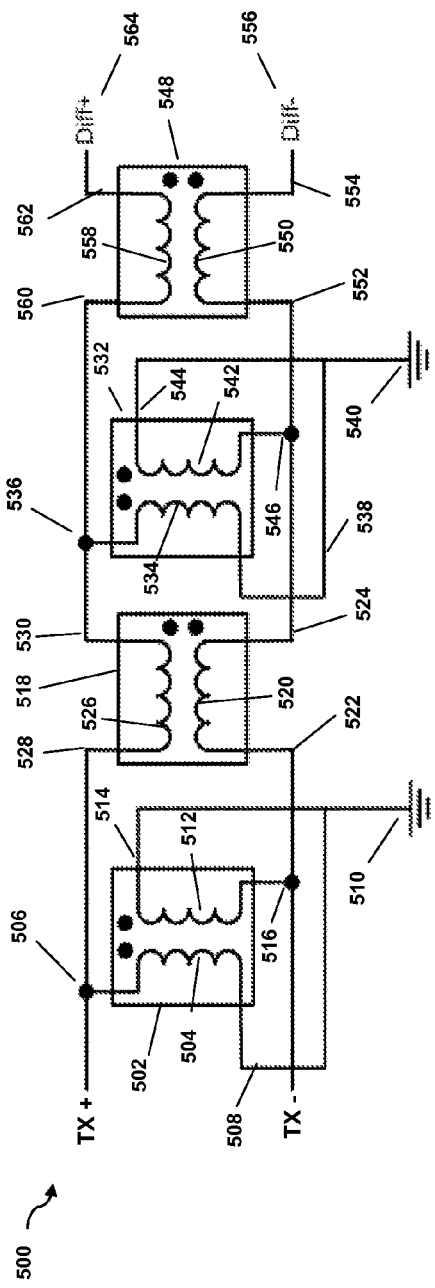
FIG. 5 illustrates a schematic diagram of a cascaded shunt circuit operable to be employed by a differential driver circuit according to a further aspect of the disclosure.

FIG. 5 illustrates a schematic diagram of a cascaded shunt circuit, depicted generally at 500, and operable to be coupled to a differential driver circuit that can be used in association with the communication interface 142 of the information handling system 100 illustrated in FIG. 1. The cascaded shunt circuit 500 can be employed, in whole or in part, by the information handling system 100 illustrated in FIG. 1 or other types of information handling systems, circuits, devices, components, or any combination thereof that can benefit from one or more features or functions of the cascaded shunt circuit 500.

The cascaded shunt circuit 500 can include a first shunt element 502 including an in-phase transformer having a first primary transformer element 504 coupled to a first terminal 506 and a second terminal 508. The second terminal 508 can be further coupled to a first ground reference 510. The first shunt element 502 can also include a first secondary transformer element 512 coupled to a third terminal 514 and a fourth terminal 516. The third terminal 514 can be further coupled to the first ground reference 510.

The cascaded shunt circuit 500 can also include a second shunt element 518 coupled to the first shunt element 502. The second shunt element 518 can include a second primary transformer element 520 coupled to a fifth terminal 522 and a sixth terminal 524. The second shunt element 518 can further include a second secondary transformer element 526 coupled to a seventh terminal 528 and an eight terminal 530. In one form, the fifth terminal 522 of the second shunt element 518 can be coupled to the fourth terminal 516 of the first shunt element 502. Additionally, the seventh terminal 528 can be coupled to the first terminal 506 of the first shunt element 502. In this manner, the first shunt element 502 and the second shunt element 518 in a cascaded arrangement.

According to another aspect, the second shunt element 518 can be coupled to a third shunt element 532. The third shunt element 532 can include an in-phase transformer including a third primary transformer element 534 coupled to a ninth terminal 536 and a tenth terminal 538. The tenth terminal 538 can also be coupled to a second ground reference 540. The third shunt element 532 can also include a third secondary transformer element 542 coupled to an eleventh terminal 544 and a twelfth terminal 546. The eleventh terminal 544 can be coupled to the second ground reference 540. The third shunt element 532 can be coupled to the second shunt element 518 by connecting the ninth terminal 536 of the third shunt element 532 to the eight terminal 530 of the second shunt element 518. Additionally, the twelfth terminal 546 of the third shunt element 532 can be connected to the sixth terminal of the second shunt element 518.

According to a further aspect, the cascaded circuit 500 can include a fourth shunt element 532 coupled to the third shunt element 520. For example, the fourth shunt element 532 can include an in-phase transformer having a fourth primary element 550 coupled to a thirteenth terminal 552. The fourth primary element 534 can also be coupled to a fourteenth terminal 554. The fourteenth terminal 554 can be coupled to a negative differential output terminal 556 operable to be coupled to a differential drive circuit (not illustrated). The fourth shunt element 548 can also include a fourth secondary element 558 coupled to a fifteenth terminal 560 and a sixteenth terminal 562. The sixteenth terminal 562 can further be coupled to a positive differential output terminal 564 of a differential drive circuit (not illustrated). In this manner, a cascaded circuit of shunt devices can be coupled to a differential signaling circuit for use in association with a communication bus.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A communication interface comprising:
 a drive circuit including a differential signaling circuit operable to be coupled to a communication bus;
 a shunt circuit coupled to the differential signaling circuit, the shunt circuit including a first transformer circuit comprising:
  a primary transformer element coupled between a first terminal and a second terminal, wherein:

the first terminal is coupled to the differential signaling circuit and a first communication line; and
the second terminal is coupled to a bias voltage level;
a secondary transformer element coupled between a third terminal and a fourth terminal, wherein:
the third terminal is coupled to the bias voltage level; and
the fourth terminal is coupled to the differential signaling circuit, and further coupled to a second communication line; and
a communication port coupled to the first communication line and the second communication line, the communication port operable to be coupled to a communication bus.

2. The communication interface of claim 1, further comprising:
the primary transformer element responsive to a first output of the differential signaling circuit; and
the secondary transformer element responsive to the primary transformer element.

3. The communication interface of claim 2, wherein the second terminal is coupled to the third terminal.

4. The communication interface of claim 1, wherein the bias voltage level includes a ground bias voltage level.

5. The communication interface of claim 1, further comprising a capacitive element including:
a first capacitive terminal coupled to the second terminal and the third terminal; and
a second capacitive terminal coupled to the bias voltage level.

6. The communication interface of claim 1, further comprising a resistive element including:
a first resistive terminal coupled to the second terminal and the third terminal; and
a second resistive terminal coupled to the bias voltage level, the bias voltage level including a ground bias voltage level.

7. The communication interface of claim 1, wherein the shunt circuit includes a cascaded shunt circuit.

8. The communication interface of claim 7, wherein the cascaded shunt circuit includes:
a second transformer circuit coupled to the first transformer circuit;
a third transformer circuit coupled to the second transformer circuit; and
a fourth transformer circuit coupled to the third transformer circuit, the first communication line, and the second communication line.

9. The communication interface of claim 8, wherein the communication bus includes a serial attached SCSI (SAS) communication bus.

10. A circuit operable to communicate signals via a communication bus, the circuit comprising:
a differential signaling circuit operable to be coupled to a communication bus;
a shunt circuit including a first transformer circuit comprising:
a primary transformer element coupled between a first terminal and a second terminal, wherein:
the first terminal is coupled to the differential signaling circuit and a first communication line operably associated with the communication bus; and
the second terminal is coupled to a bias voltage level;
a secondary transformer element coupled between a third terminal and a fourth terminal, wherein:
the third terminal is coupled to the bias voltage level; and
the fourth terminal is coupled to the differential signaling circuit and a second communication line operably associated with the communication bus.

11. The circuit of claim 10, further comprising a capacitive element coupled to the third terminal and the bias voltage level.

12. The circuit of claim 10, further comprising a resistive element coupled to the third terminal and the bias voltage level.

13. The circuit of claim 10, further comprising:
wherein the second terminal is coupled to the third terminal; and
wherein the bias voltage level includes a ground bias voltage level.

14. The circuit of claim 10, further comprising a cascaded shunt circuit.

15. The circuit of claim 14, wherein the cascaded shunt circuit comprises:
a second transformer circuit coupled to the first transformer circuit;
a third transformer circuit coupled to the second transformer circuit; and
a fourth transformer circuit coupled to the third transformer circuit.

16. The circuit of claim 10, wherein the communication bus includes a serial attached SCSI (SAS) communication bus.

17. An information handling system comprising:
a communication port operable to be coupled to a communication bus operably associated with an electronic device; and
a differential signaling circuit operable to be coupled to the communication bus to communicate with the electronic device;
a shunt circuit coupled to the differential signaling circuit, the shunt circuit including a first transformer comprising:
a primary transformer element coupled between a first terminal and a second terminal, wherein:
the first terminal is coupled to a first current carrying element of the differential signaling circuit and a first communication line operably associated with the communication bus; and
the second terminal is coupled to a bias voltage level;
a secondary transformer element coupled between a third terminal and a fourth terminal, wherein:
the third terminal is coupled to the bias voltage; and
the fourth terminal is coupled to a second current carrying element of the differential signaling circuit and a second communication line operably associated with the communication bus.

18. The information handling system of claim 17, wherein the shunt circuit is external to the differential signaling circuit.

19. The information handling system of claim 18, wherein the communication bus includes a serial attached SCSI (SAS) communication bus.

20. The information handling system of claim 19, wherein the electronic device comprises:
a device drive circuit operable to communicate using the SAS communication bus; and
a device shunt circuit operably coupled to the device drive circuit and the SAS communication bus.

* * * * *